(12) United States Patent
Higashida et al.

(10) Patent No.: US 6,608,756 B2
(45) Date of Patent: Aug. 19, 2003

(54) BRIDGING BOARD

(75) Inventors: Hiroshi Higashida, Tokyo (JP); Takaki Endo, Tokyo (JP)

(73) Assignee: KEL Corporation, Tokyo (JP)

( * ) Notice: Subject to any disclaimer, the term of this patent is extended or adjusted under 35 U.S.C. 154(b) by 0 days.

(21) Appl. No.: 09/924,189

(22) Filed: Aug. 6, 2001

(65) Prior Publication Data

US 2002/0030974 A1 Mar. 14, 2002

(30) Foreign Application Priority Data

Sep. 11, 2000 (JP) ........................................ 2000-274896

(51) Int. Cl.[7] .......................... H05K 1/14; H01R 12/16
(52) U.S. Cl. ........................ 361/748; 361/785; 361/790
(58) Field of Search ................................ 361/728, 729, 361/735–737, 748–749, 760, 778, 784, 785, 790–792, 789, 803; 174/35 C, 250–251, 255, 260–261; 439/43–53, 55, 259–268, 493

(56) References Cited

U.S. PATENT DOCUMENTS 5,442,520 A * 8/1995 Kemp ........................ 361/785
6,011,791 A * 1/2000 Okada ........................ 370/352
6,049,571 A * 4/2000 Hasegawa ................... 375/292
6,080,946 A * 6/2000 Lee ............................. 200/293

* cited by examiner

Primary Examiner—David Martin
Assistant Examiner—Michael L. Lindinger
(74) Attorney, Agent, or Firm—Robert W. J. Usher

(57) ABSTRACT

An upstream side motherboard 50 having an upstream side system slot 51 and upstream side daughter board mounting slots 52 to 58 and a downstream side motherboard 60 having a downstream side system slot 61 and downstream side daughter board mounting slots 62, 63 . . . are connected together by a bridging board 10. The bridging board 10 has bridge wires that electrically connect a plurality of wiring pins provided in the upstream side daughter board mounting slots and a plurality of wiring pins provided in the downstream side system slot when an upstream side connector 11 is fitted into one the upstream side daughter board mounting slots and a downstream side connector 12 is fitted into the downstream side system slot 61, and IC switches 13 and 14 that carry out connection changing on prescribed wires out of the bridge wires.

5 Claims, 6 Drawing Sheets

Fig. 6

| SELECTOR SWITCHES / DOWN STREAM SIDE | 16 17 ▨▨/▨▨ | 16 17 ○○/▨▨ | 16 17 ▨▨/○○ | 16 17 ○○/○○ |
|---|---|---|---|---|
| | UPSTREAM SIDE | | | |
| A3 (INTA) | A3 (INTA) | A3 (INTD) | A3 (INTC) | A3 (INTB) |
| B3 (INTB) | B3 (INTB) | B3 (INTA) | B3 (INTD) | B3 (INTC) |
| C3 (INTC) | C3 (INTC) | C3 (INTB) | C3 (INTA) | C3 (INTD) |
| E3 (INTD) | E3 (INTD) | E3 (INTC) | E3 (INTB) | E3 (INTA) |

BRIDGING BOARD

FIELD OF THE INVENTION

The present invention relates to a bridging board used for connecting together two motherboards to obtain a single motherboard structure.

BACKGROUND OF THE INVENTION

The constitution of an electronic device such as a computer in which a plurality of daughter board mounting slots are provided on a motherboard and a daughter board is mounted in each daughter board mounting slot is well known. In this case, the upper limit for the number of slots that can be provided on one motherboard is determined from the specifications of the computer configuration (for example a maximum of 8 slots). However, there are often demands to make it possible to use more daughter boards than this number set from the specifications, i.e. to increase the number of slots. A conventional method for answering to such demands is to provide a bridge circuit so that a number of slots beyond the above-mentioned upper limit can be installed.

A motherboard having a number of slots within the upper limit determined from the specifications always has a structure comprising a single system slot in which a system board is mounted and a plurality of daughter board mounting slots connected to the system slot via bus wiring; with only a single system slot, it is not possible for the above-mentioned upper limit to be exceeded. To construct a motherboard structure having a number of slots exceeding the above-mentioned upper limit, it is possible to use two motherboards each having a system slot, but there is then a problem that two system boards are required. A constitution of a single motherboard has thus been conceived in which a single downstream side (expansion side) system slot is provided in a section for additional expansion, and a plurality of downstream side daughter board mounting slots are connected to this downstream side system slot via downstream side bus wiring.

However, the motherboard thus constituted (the downstream side motherboard) is integrated with an upstream side motherboard so that the two function as a single motherboard, and hence the same functionality is obtained as when one of the upstream side daughter board mounting slots of the upstream side motherboard is connected to the system slot of the downstream side motherboard using a bridge circuit as described above and a system board is mounted in the downstream side system slot using an IC or the like provided in the bridge circuit.

If the bus wires connected to the connecting pins of the upstream side daughter board mounting slots have a non-parallel configuration, then a different type of signal is applied to each of the slots. In this case, it must be decided in advance which of the upstream side daughter board mounting slots to connect to the downstream side system slot using the bridge circuit, and connection of the non-parallel bus wires must be carried out accordingly.

When connection is carried out using a bridge circuit as described above, there is a problem that whenever the constituent upstream side and downstream side motherboards differ, the bridge circuit must be set correspondingly. Moreover, in actual practice, considering cost and product compatibility, there are often cases where one wants to directly connect two existing motherboards together to construct a single motherboard having an increased number of slots, and hence it is desirable to make it possible to meet such demands.

SUMMARY OF THE INVENTION

An object of the present invention is to provide a bridging board for connecting any two given motherboards together both physically and electrically to produce a structure that can be used as a single motherboard.

The bridging board of the present invention is for connecting an upstream side motherboard having an upstream side system slot and one or more upstream side daughter board mounting slots and a downstream side motherboard having at least a downstream side system slot. The bridging board has an upstream side connector fittable into any one of the upstream side daughter board mounting slots and a downstream side connector fittable into the downstream side system slot. The bridging board also has a plurality of bridge wires that electrically connect a plurality of wiring pins provided in the upstream side daughter board mounting slot and a plurality of wiring pins provided in the downstream side system slot when the upstream side connector is fitted into the upstream side daughter board mounting slot and the downstream side connector is fitted into the downstream side system slot, and IC switches that carry out connection changing on prescribed wires out of the plurality of bridge wires.

If a bridging board having such a constitution is used, then regardless of what kind of motherboards are used as the upstream side and downstream side motherboards, by connecting the motherboards together using the bridging board and then suitably setting the connection changing of the bus wires using the IC switches, it is possible to use the two motherboards as a single motherboard in which the two motherboards are integrated both mechanically and electrically. It is thus possible to connect any plurality of motherboards together using bridging boards according to the present invention, and hence construct a single motherboard having a large number of daughter board mounting slots.

Note that it is bus wires that have a non-parallel configuration in the upstream side and downstream side daughter board mounting slots for which connection changing is carried out using IC switches in this way. Moreover, the downstream side motherboard generally has at least one downstream side daughter board mounting slot in addition to the downstream side system slot, thus allowing a large number of daughter boards to be mounted.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention and wherein:

FIG. 6 is a table showing wiring connection changing patterns of the bridging board corresponding to different operational states of connection change setting selector switches.

DESCRIPTION OF THE PREFERRED EMBODIMENTS

Figure 1:
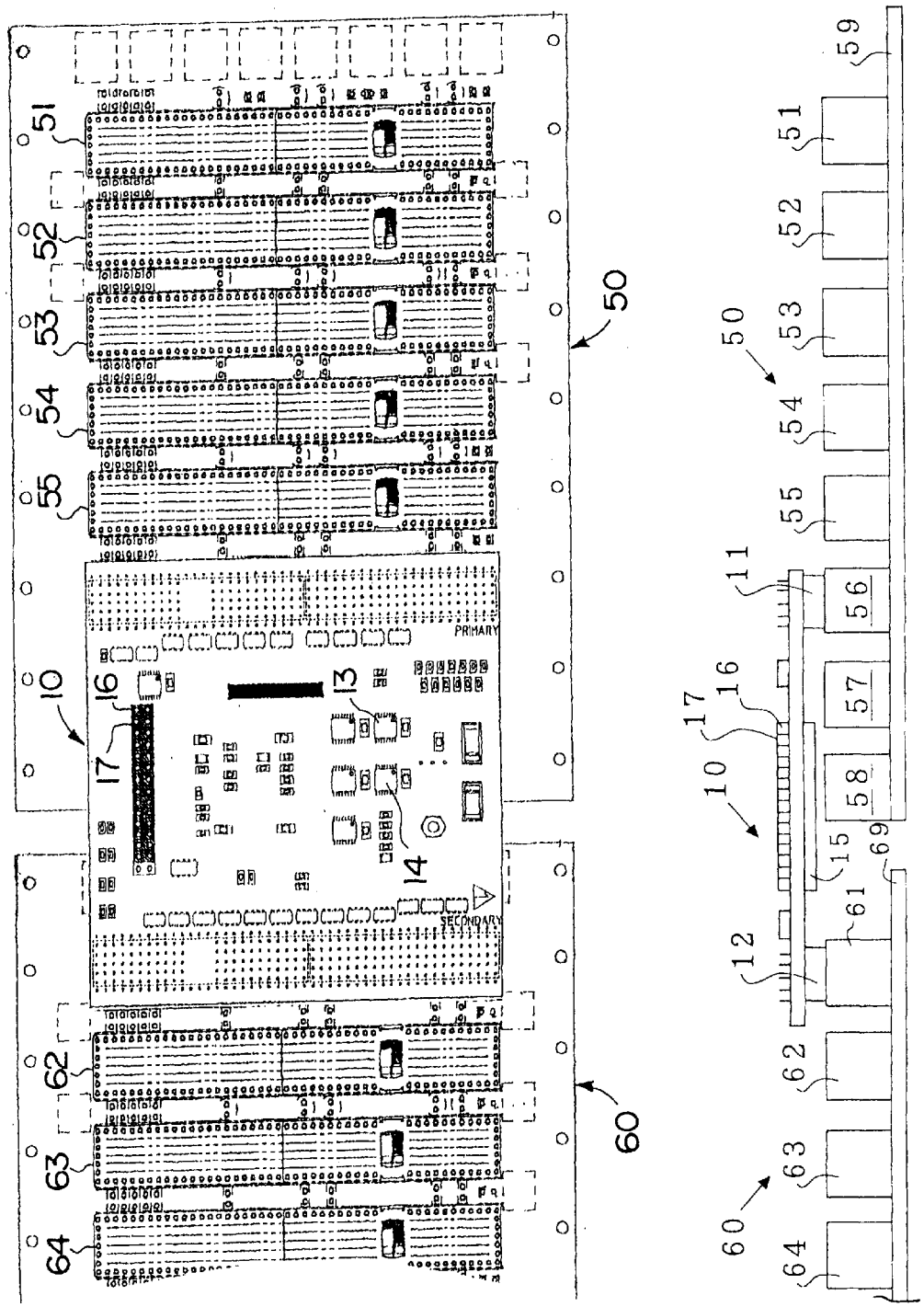
FIG. 1 consists of a plan view and a front view showing a state in which two motherboards are connected together using a bridging board according to an embodiment of the present invention.
Figure 2B:
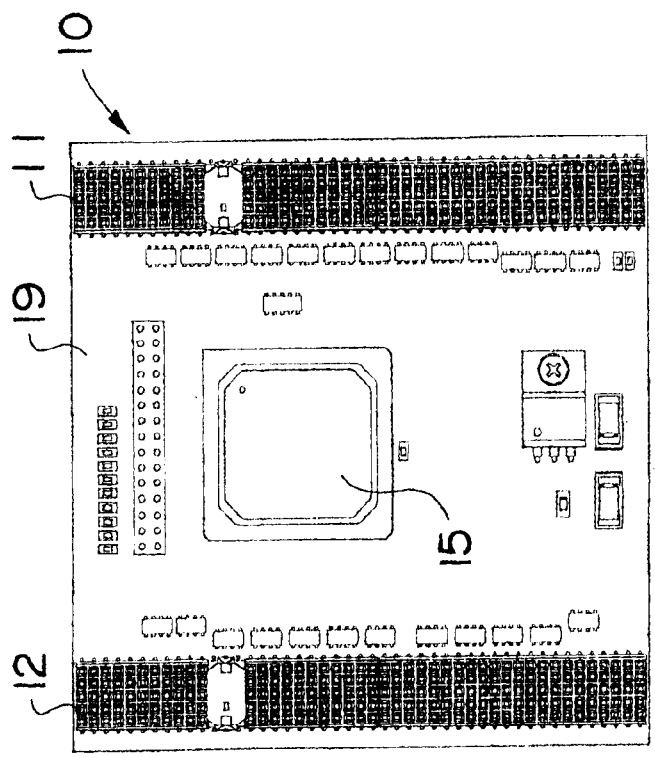
FIGS. 2A and 2B are a plan view and a bottom view respectively showing a bridging board according to an embodiment of the present invention.
Figure 2A:
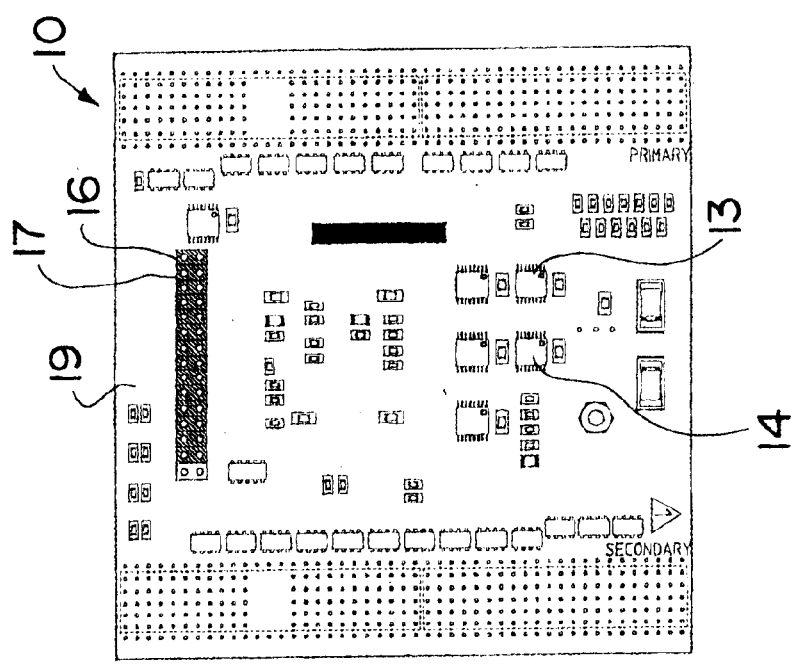

Following is a description of a preferred embodiment of the present invention with reference to the drawings. FIG. 1 shows an example in which two motherboards 50 and 60 are connected together using a bridging board 10 to which the present invention has been applied to form a single motherboard structure. As shown in FIG. 2, the bridging board 10 has a constitution in which an upstream side connector 11 (a plug connector), a downstream side connector 12 (also a plug connector) and a system setting IC 15 are provided on the rear face of a substrate 19, and connection change setting ICs 13 and 14 and connection change setting selector switches 16 and 17 are provided on the front face.

Figure 3:
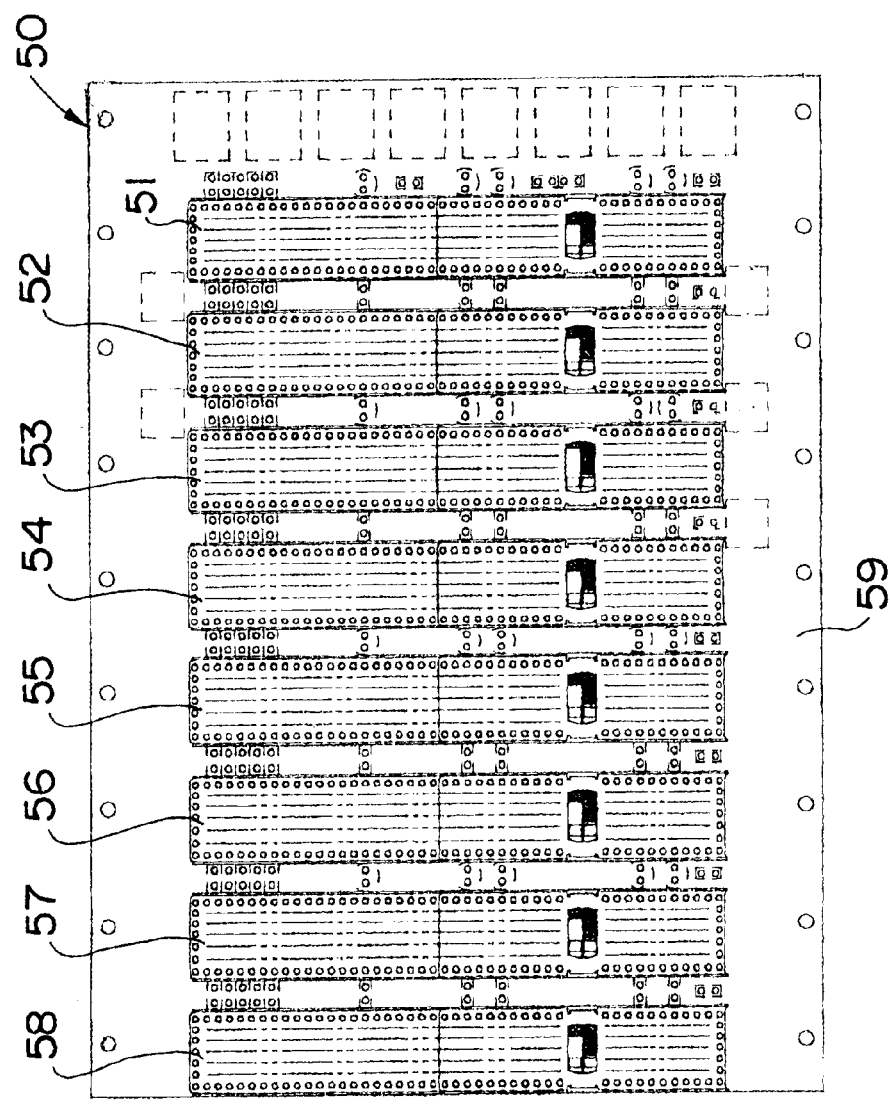
FIG. 3 is a plan view showing an example of a motherboard.

The motherboard 50 has a constitution in which a system slot 51 positioned at an end thereof and daughter board mounting slots 52 to 58 arranged in a line next to the system slot 51 are provided on a substrate 59. Likewise, the motherboard 60 has a constitution in which a system slot 61 (the no. 1 slot) positioned at an end thereof and daughter board mounting slots 62, 63, 64 . . . arranged in a line next to the system slot 61 are provided on a substrate 69. The motherboard 50 is shown in FIG. 3. In this example, the motherboard 50 has one system slot (the no. 1 slot) 51 and seven daughter board mounting slots 52 to 58 (the no. 2 to no. 8 slots), but there may be any number from one to seven daughter board mounting slots. In other words, each motherboard has a system slot and one or more daughter board mounting slots, although due to a specification-related limitation, it is only possible to connect a maximum of seven daughter board mounting slots per one system slot. Note also that a case in which daughter boards are not used is also conceivable, in which case the motherboard will have only the system slot.

When the two motherboards 50 and 60 are connected together using the bridging board 10 as shown in FIG. 1, the upstream side connector 11 is fitted into any of the daughter board mounting slots of the motherboard 50 (in FIG. 1 the no. 6 slot 56), and the downstream side connector 12 is fitted into the system slot 61 of the motherboard 60. As a result, the motherboard 50 becomes the upstream side motherboard and the motherboard 60 becomes the downstream side motherboard. With this constitution, a system board is mounted into the system slot 51 of the upstream side motherboard 50, and daughter boards mounted in the daughter board mounting slots 52 to 58 of the upstream side motherboard 50 are connected to this system board via bus wiring on the upstream side motherboard 50 and are controlled by the system board.

Regarding the downstream side motherboard 60, on the other hand, although only the downstream side connector 12 of the bridging board 10 is connected into the downstream side system slot 61, due to the system IC provided on the bridging board 10, signals are received from the system board provided on the upstream side motherboard 50, which is connected via the upstream side connector 11, and hence signals are sent just as if a system board were mounted in the downstream side system slot 61. As a result, daughter boards mounted in the daughter board mounting slots 62, 63, 64 . . . of the downstream side motherboard 60 are connected via the bus wiring on the downstream side motherboard 60 to a system board 'virtually' mounted in the downstream side system slot 61 (i.e. the system board mounted in the system slot 51 of the upstream side motherboard 50), and are controlled by this 'virtual' system board. As is evident from the above, the downstream side connector 12 of the bridging board 10 must be connected into the system slot of the downstream side motherboard.

As a result of the above, a state is achieved in which all of the daughter board mounting slots of both the upstream and the downstream side motherboards 50 and 60 are controlled by the system board in the system slot 51 of the upstream side motherboard 50. The two motherboards 50 and 60 connected together by the bridging board 10 as shown in FIG. 1 thus function as a single integrated motherboard controlled by a single system board. As a result, the number of daughter board mounting slots can be increased as much as one wishes. Note that, although in FIG. 1 all of the slots are arranged on the front faces of the motherboards 50 and 60, a configuration in which a slot into which the upstream side connector 11 of the bridging board 10 is fitted is provided on the rear face of the upstream side motherboard 50 and the downstream side system slot 61 into which the downstream side connector 12 of the bridging board 10 is fitted is provided on the rear face of the downstream side motherboard 60, with the bridging board 10 being placed on the rear face side, is also possible.

If, on the motherboards 50 and 60, the bus wires that connect the large number of terminals provided in the slots are all parallel wires, then the bridging board 10 need merely have a plurality of wires that connect the terminals of the daughter board mounting slot on the upstream side motherboard into which the upstream side connector 11 is connected and the terminals of the system slot on the downstream side motherboard into which the downstream side connector 12 is connected, following the correspondence relationship therebetween. However, if the motherboard specifications specify that non-parallel bus wires be provided, then setting the bridge wiring that connects these non-parallel bus wires together becomes a problem.

Figure 4:
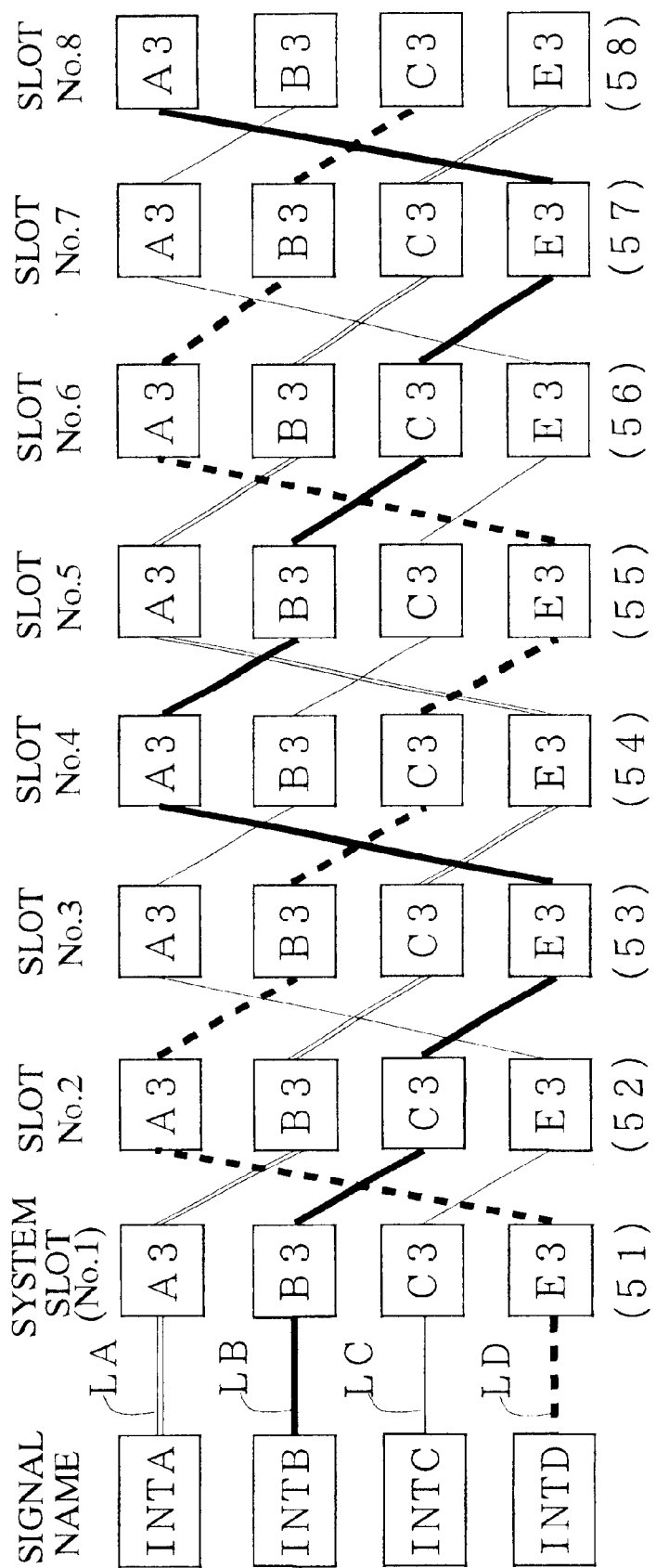
FIG. 4 is a schematic view depicting non-parallel bus wiring on a motherboard.

A description of an example of such non-parallel bus wiring will now be given with reference to FIG. 4. It should be noted that FIG. 4 shows only an illustrative example of wiring connections that make up non-parallel bus wiring, and not wiring matching actual specifications. An example of non-parallel bus wiring is wiring that connects terminal pins in A3 positions, B3 positions, C3 positions and E3 positions of the slots 51 to 58 of the upstream side motherboard as in FIG. 4. In FIG. 4, the terminal pins A3, B3, C3 and E3 are connected in chains using a first bus wire represented by the double line LA, a second bus wire represented by the thick line LB, a third bus wire represented by the thin line LC and a fourth bus wire represented by the broken line LD, with the chains crossing one another.

Setting is carried out such that interrupt signals INTA, INTB, INTC and INTD are sent through the non-parallel bus wires LA, LB, LC and LD respectively. Moreover, according to the specifications, in the system slot 51, wire LA must be connected to the terminal pin A3 so that the signal INTA passes therethrough, wire LB must be connected to the terminal pin B3 so that the signal INTB passes therethrough, wire LC must be connected to the terminal pin C3 so that the signal INTC passes therethrough, and wire LD must be connected to the terminal pin E3 so that the signal INTD passes therethrough. The non-parallel bus wiring configuration is also similar for the downstream side motherboard 60, and it is necessary to set the bridge wiring such that the interrupt signals INTA, INTB, INTC and INTD are connected to the terminal pins A3, B3, C3 and E3 respectively of the downstream side system slot 61.

It is apparent from the above that when the motherboards 50 and 60 are connected together using the bridging board 10, the connection of the non-parallel wires LA to LD is a problem. For example, if the upstream side connector 11 of the bridging board 10 is connected into the no. 6 slot 56 of the upstream side motherboard 50 as shown in FIG. 1, then as shown in FIG. 4 the interrupt signals INTD, INTA, INTB, and INTC respectively are connected to the terminal pins A3, B3, C3 and E3 of the no. 6 slot 56. However, it is necessary to connect the interrupt signals INTA, INTB, INTC and INTD respectively to the terminal pins A3, B3, C3 and E3 of the system slot 61 of the downstream side motherboard 60 which is connected using the bridging board 10.

Wiring connection changing must thus carried out in the bridging board 10 such that the interrupt signals INTA, INTB, INTC and INTD respectively are connected to the terminal pins A3, B3, C3 and E3 of the downstream side system slot 61. As mentioned earlier, connection change setting ICs 13 and 14 and connection change setting selector switches 16 and 17 are provided in the bridging board 10 for carrying out this wiring connection changing.

Figure 5:
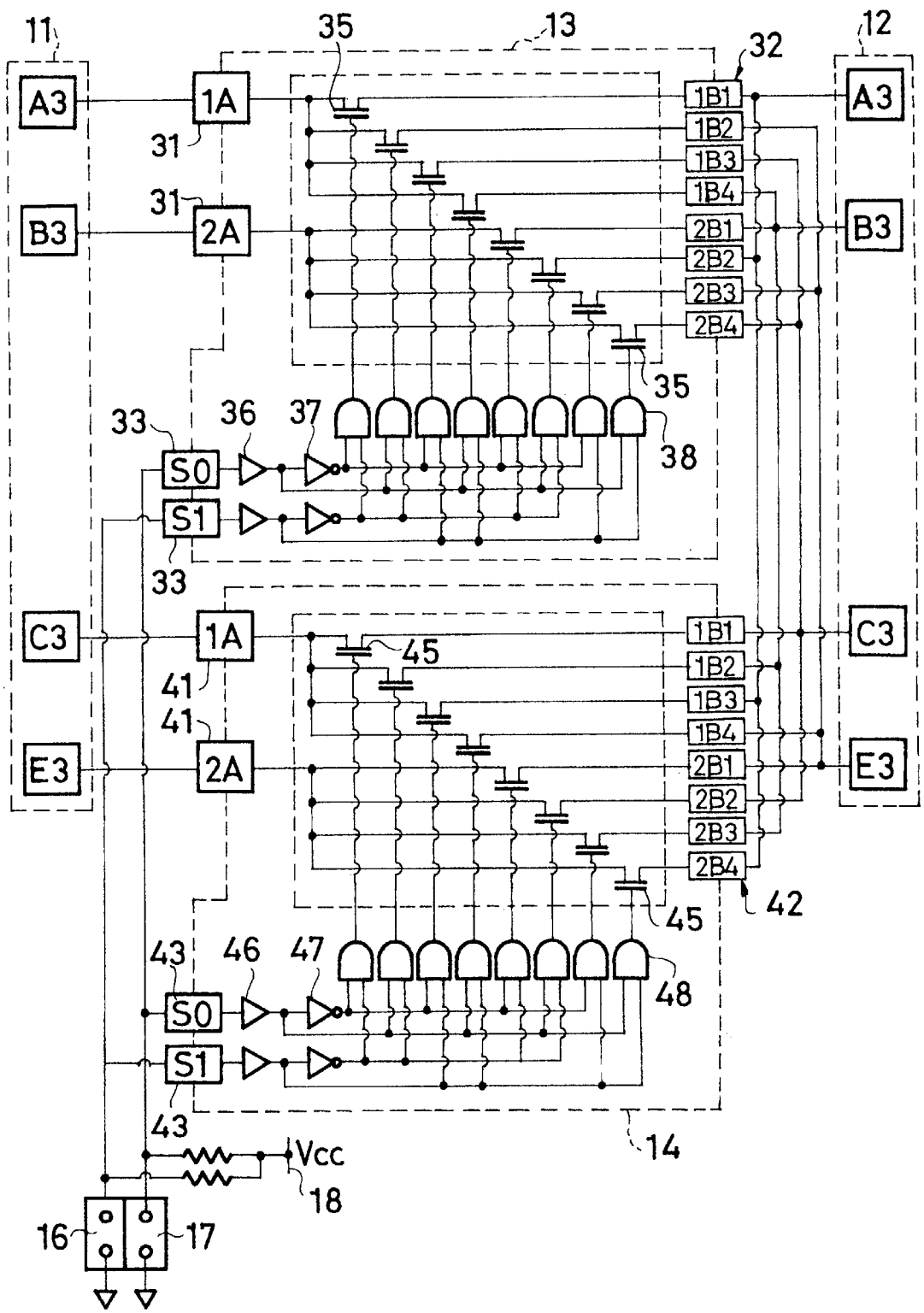
FIG. 5 is a circuit diagram showing the wiring connection changing circuit configuration of the bridging board.

The bridge wiring connection changing circuit configuration is shown in FIG. 5. The connection change setting IC 13 has two input ports 31 (1A, 2A), eight output ports 32 (1B1 to 1B4, 2B1 to 2B4), and two switching signal ports 33 (S0, S1), and inside has eight semiconductor switches 35, a pair of driver circuits 36 and 37, and eight OR circuits 38; similarly, the connection change setting IC 14 also has two input ports 41 (1A, 2A), eight output ports 42 (1B1 to 1B4, 2B1 to 2B4), and two switching signal ports 43 (S0, S1), and inside has eight semiconductor switches 45, a pair of driver circuits 46 and 47, and eight OR circuits 48; wiring connections are made as shown in FIG. 5. Moreover, as shown in FIG. 5, the input ports 31 and 41 (1A, 2A) are connected respectively to the A3, B3, C3 and E3 terminals of the upstream side connector 11, and the output ports 32 and 42 (1B1 to 1B4, 2B1 to 2B4, 1B1 to 1B4, 2B1 to 2B4) are connected to the A3, B3, C3 and E3 terminals of the downstream side connector 12.

The connection change setting selector switches 16 and 17 are short pin switches; each switch is off when the short pin is removed and on when the short pin is inserted. As shown in FIG. 5, the switches 16 and 17 are each connected to one of the switching signal ports 33 of the connection change setting IC 13 and one of the switching signal ports 43 of the connection change setting IC 14, and are also connected to a power source line 18 via a resistor. As a result, when the short pin of one of the switches 16 and 17 is removed, an H (high) signal is applied to the corresponding switching signal ports 33 and 43, and when the short pin is inserted, an L (low) signal is applied to the corresponding switching signal ports 33 and 43.

As is apparent from the circuit configuration, by changing the insertion/removal pattern of the short pins of the connection change setting selector switches 16 and 17, changing of the connections between the A3, B3, C3 and E3 terminals of the upstream side connector 11 and the A3, B3, C3 and E3 terminals of the downstream side connector 12 can be carried out freely. The relationship between the insertion/removal pattern of the short pins of the connection change setting selector switches 16 and 17 and the connection change setting of the A3, B3, C3 and E3 terminals of the upstream side connector 11 and the downstream side connector 12 of the bridging board 10 is shown in FIG. 6. In FIG. 6, the state in which the short pin of the switch 16 or 17 is inserted is indicated by hatching.

As can be seen from FIG. 6, when, for example, the short pins of both switches 16 and 17 are inserted, if the interrupt signals INTA, INTB, INTC and INTD are inputted respectively into the terminal pins A3, B3, C3 and E3 on the upstream side, then the interrupt signals INTA, INTB, INTC and INTD are outputted respectively from the terminal pins A3, B3, C3 and E3 on the downstream side. Similarly, when the short pin of only the switch 17 is inserted, if the interrupt signals INTD, INTA, INTB and INTC are inputted respectively into the terminal pins A3, B3, C3 and E3 on the upstream side, then the interrupt signals INTA, INTB, INTC and INTD are outputted respectively from the terminal pins A3, B3, C3 and E3 on the downstream side.

If, for example, as shown in FIG. 1, the upstream side connector 11 of the bridging board 10 is fitted into the no. 6 slot 56 of the upstream side motherboard 50 and the downstream side connector 12 is fitted into the system slot 61 of the downstream side motherboard 60, then as can be seen from FIG. 4, the interrupt signals INTD, INTA, INTB and INTC are inputted respectively into the terminal pins A3, B3, C3 and E3 of the no. 6 slot 56. Finding this pattern in FIG. 6, it can be seen that if the short pin of the switch 16 is removed and the short pin of the switch 17 is inserted, then the interrupt signals INTA, INTB, INTC and INTD will be outputted respectively from the terminal pins A3, B3, C3 and E3 of the system slot 61 of the downstream side motherboard 60. As a result, the downstream side motherboard 60 can be integrated with the upstream side motherboard 50 such that the two function as a single motherboard.

As is apparent from the above, the upstream side connector 11 of the bridging board 10 can be fitted into any of the no. 2 to no. 8 slots 52 to 58 (the daughter board mounting slots) of the upstream side motherboard 50. The insertion/removal pattern of the short pins of the connection change setting selector switches 16 and 17 should be set in accordance with which of the slots 52 to 58 the upstream side connector 11 is fitted into, such that the interrupt signals INTA, INTB, INTC and INTD are outputted respectively from the terminal pins A3, B3, C3 and E3 of the system slot 61 of the downstream side motherboard 60.

By using the bridging board 10, any two motherboards can thus be connected together so as to function as a single motherboard. A plurality of existing motherboards can thus be freely connected on site using bridging boards so as to function as a single motherboard. Moreover, as is apparent from the above description, because semiconductor switches 35 and 45 are used in the bridging board for the connection changing, high speed signal connection is possible.

If the bridging board according to the present invention is used as described above, then regardless of what kind of motherboards are used as upstream side and downstream side motherboards, by connecting the motherboards together using the bridging board and then suitably setting the connection switching of the bus wiring using the IC switches, the two motherboards can be integrated both mechanically and electrically and used as a single motherboard. It is thus possible to connect together any plurality of motherboards using bridging boards according to the present invention to easily construct a single motherboard having a large number of daughter board mounting slots.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

RELATED APPLICATIONS

This application claims the priority of Japanese Patent Application No. 2000-274896 filed on Sep. 11, 2000, which is incorporated herein by reference.

What is claimed is:

1. A bridging board that connects together an upstream side motherboard having an upstream side system slot and one or more upstream side daughter board mounting slots and a downstream side motherboard having at least a downstream side system slot, the bridging board having an upstream side connector fittable into one of said upstream side daughter board mounting slots and a downstream side connector fittable into said downstream side system slot, and also having a plurality of bridge wires that electrically connect a plurality of wiring pins provided in one of said upstream side daughter board mounting slots and a plurality of wiring pins provided in said downstream side system slot when said upstream side connector is fitted into said one of said upstream side daughter board mounting slots and said downstream side connector is fitted into said downstream side system slot, and IC switches that carry out connection changing of said bridge wires, which are connected to bus wires having a non-parallel wiring configuration in said upstream side and downstream side daughter board mounting slots.

wherein both said upstream side connector and said downstream side connector are provided on a same face of a bridging board substrate and are plugged into said one of said upstream side daughter board mounting slots and said downstream side system slot, respectively, whereby said bridging board locates said upstream side motherboard and said downstream side motherboard extending in substantially uniplanar, edge-to-edge relation to each other.

2. The bridging board according to claim 1, wherein said IC switches are composed of connection change setting ICs and connection change setting selector switches.

3. The bridging board according to claim 2, further having a configuration wherein said upstream side connector, said downstream side connector and a system setting IC are provided on a rear face of a substrate and said connection change setting ICs and said connection change setting selector switches are provided on a front face of said substrate.

4. The bridging board according to claim 1, wherein said downstream side motherboard has one or more downstream side daughter board mounting slots in addition to said downstream side system slot.

5. The bridging board according to claim 2, wherein said connection change setting selector switches are short pin switches.

* * * * *